United States Patent
Shim et al.

(10) Patent No.: US 9,112,177 B2
(45) Date of Patent: Aug. 18, 2015

(54) ORGANIC LIGHT EMITTING DIODE, ORGANIC LIGHT EMITTING DISPLAY PANEL INCLUDING THE SAME, AND METHOD OF MANUFACTURING THE ORGANIC LIGHT EMITTING DISPLAY PANEL

(71) Applicant: Samsung Display Co., Ltd., Yongin, Gyeonggi-do (KR)

(72) Inventors: Woo Sub Shim, Seoul (KR); Byung Seon An, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 88 days.

(21) Appl. No.: 13/946,925

(22) Filed: Jul. 19, 2013

(65) Prior Publication Data

US 2014/0284560 A1    Sep. 25, 2014

(30) Foreign Application Priority Data

Mar. 22, 2013    (KR) .......................... 10-2013-0031043

(51) Int. Cl.
*H01L 51/52*    (2006.01)
*H01L 51/56*    (2006.01)

(52) U.S. Cl.
CPC ............ *H01L 51/5203* (2013.01); *H01L 51/56* (2013.01)

(58) Field of Classification Search
USPC .................................. 257/40, 88, 79; 438/34
See application file for complete search history.

(56) References Cited

U.S. PATENT DOCUMENTS

| 2005/0248264 | A1 | 11/2005 | Cok |
| 2006/0183394 | A1 | 8/2006 | Kim et al. |
| 2007/0057264 | A1* | 3/2007 | Matsuda .......................... 257/88 |
| 2010/0200841 | A1 | 8/2010 | Cheon et al. |
| 2013/0019936 | A1* | 1/2013 | Hsieh et al. ................... 136/256 |

FOREIGN PATENT DOCUMENTS

| KR | 10-2006-0090485 A | 8/2006 |
| KR | 10-2011-0138338 A | 12/2011 |

* cited by examiner

*Primary Examiner* — Zandra Smith
*Assistant Examiner* — Lawrence Tynes, Jr.
(74) *Attorney, Agent, or Firm* — Christie, Parker & Hale, LLP

(57) ABSTRACT

Provided are an organic light emitting diode, an organic light emitting display panel including the same, and a method of manufacturing the organic light emitting display panel. The organic light emitting diode includes: an anode electrode on a substrate; a first common layer on the anode electrode to inject or transport holes and having a non-flat side; an organic light emitting layer on the first common layer; a planarization layer on the non-flat side of the first common layer, providing a flat side to the organic light emitting layer, transporting holes from the first common layer to the organic light emitting layer, and including perfluorocyclobutanes (PFCBs); and a cathode electrode on the organic light emitting layer.

15 Claims, 12 Drawing Sheets

ORGANIC LIGHT EMITTING DIODE, ORGANIC LIGHT EMITTING DISPLAY PANEL INCLUDING THE SAME, AND METHOD OF MANUFACTURING THE ORGANIC LIGHT EMITTING DISPLAY PANEL

CROSS-REFERENCE TO RELATED APPLICATION

This application claims priority to and the benefit of Korean Patent Application No. 10-2013-0031043, filed on Mar. 22, 2013, the entire contents of which are hereby incorporated by reference.

BACKGROUND

Embodiments of the present invention disclosure herein relate to an organic light emitting diode, an organic light emitting display panel including the same, and a method of manufacturing the organic light emitting display panel, and more particularly, to an organic light emitting diode having a uniform (or substantially uniform) layer stacked structure, an organic light emitting display panel including the same, and a method of manufacturing the organic light emitting display panel.

In general, unlike a liquid crystal display device, because an organic electroluminescent display device is a self-light emitting type display, it does not require a backlight. Therefore, a lightweight and thin display device may be realized and because simple manufacturing processes are used, price competitiveness may be enhanced. Additionally, the organic electroluminescent device has attracted attention as a next-generation display operating at low voltage and having high luminous efficiency and wide viewing angle.

When the organic layer consists of a multilayer structure, luminous efficiency may be improved. The organic electroluminescent device may be formed through a dry process such as deposition or a solution (or wet) process such as printing or inkjet. When the organic electroluminescent device is formed through a solution process such as printing or inkjet, it is important to control the thickness or patterns of layers constituting an organic light emitting diode.

Generally, each layer constituting an organic light emitting diode is stacked flat. When an organic light emitting diode has a non-flat surface or non-uniform thickness, an interlayer mixing (or color mixing) phenomenon may occur during a printing process. Also, because it becomes difficult to control the movement of electrons and holes, luminous efficiency is decreased and an operating lifetime of the organic light emitting diode is reduced.

SUMMARY

Aspects of the present invention are directed toward providing an organic light emitting diode having a flat layer stacked structure, even when it is formed through a printing process, by forming a planarization layer, an organic light emitting display panel including the same, and a method of manufacturing the organic light emitting display panel.

According to one embodiment of the present invention an organic light emitting includes: an anode electrode on a substrate; a first common layer on the anode electrode, the first common layer being configured to inject or transport holes and having a non-flat side; an organic light emitting layer on the first common layer; a planarization layer on the non-flat side of the first common layer, having a flat side facing the organic light emitting layer, the planarization layer being configured to transport holes from the first common layer to the organic light emitting layer, and including perfluorocyclobutanes (PFCBs); and a cathode electrode on the organic light emitting layer.

The first common layer may include at least one of a hole injection layer and a hole transport layer.

The first common layer may include: a hole injection layer; a charge generation layer; and a hole transport layer, wherein the hole injection layer, the charge generation layer, and the hole transport layer are stacked sequentially, and wherein the charge generation layer may have a first polarity and the hole transport layer has a second polarity different from the first polarity.

The organic light emitting diode may further include a second common layer between the organic light emitting layer and the cathode electrode and configured to inject or transport electrons from the cathode electrode to the organic light emitting layer.

In even other embodiments, the second common layer may include at least one of an electron injection layer and an electron transport layer.

In another embodiment of the present invention, an organic light emitting display panels includes: a substrate; an anode electrode on the substrate; a hole injection layer on the anode electrode; a pixel definition layer on the hole injection layer, the pixel definition layer having an opening exposing a portion of the hole injection layer overlapping the anode electrode of the hole injection layer; a hole transport layer on the exposed hole injection layer, the hole transport layer having a non-flat side; an organic light emitting layer on the hole transport layer; a planarization layer covering the non-flat side of the hole transport layer, the planarization layer having a flat side facing the organic light emitting layer, the planarization layer being configured to transport holes from the hole transport layer to the organic light emitting layer, and the planarization layer including perfluorocyclobutanes (PFCBs); and a cathode electrode on the organic light emitting layer.

The organic light emitting display panels may further include a residue on the hole injection layer and overlapping a portion of the hole injection layer.

The non-flat side of the hole transport layer may have an uneven surface in an area corresponding to the residue of the hole transport layer.

The residue may be formed of the same material as the pixel definition layer.

The residue may protrude from the pixel definition layer into the opening exposing the exposed portion of the hole injection layer.

The organic light emitting display panel may further include a charge generation layer between the hole injection layer and the hole transport layer, and the charge generation layer having a different polarity from the hole transport layer.

One or more portions of the non-flat side may be convex.

The organic light emitting display panel may further include a second common layer between the organic light emitting layer and the cathode electrode, and the second common layer being configured to inject or transport electrons from the cathode electrode to the organic light emitting layer.

The second common layer may include at least one of an electron injection layer and an electron transport layer.

The pixel definition layer may include a photosensitive material.

In still other embodiments of the present invention, a method of manufacturing an organic light emitting display panel includes: forming an anode electrode on a substrate; forming a hole injection layer on the anode electrode; forming a pixel definition layer having an opening, the opening exposing a portion of the hole injection layer overlapping the anode electrode; forming a hole transport layer on the exposed portion of the hole injection layer; forming a planarization layer on the hole transport layer, the planarization layer including perfluorocyclobutanes (PFCBs); forming an organic light emitting layer on the planarization layer; and forming a cathode electrode on the organic light emitting layer.

The forming of the planarization layer may include: providing a liquid planarization material including the PFCBs to the opening; and drying the liquid planarization material provided to the opening.

The method may further include forming a charge generation layer in the opening in an area overlapping the hole injection layer, the charge generation layer having a different polarity from the hole transport layer, the forming the charge generation layer occurring between the forming of the hole injection layer and the forming of the hole transport layer.

The forming of the organic light emitting layer may include: providing a liquid light emitting material on the planarization layer; and drying the liquid light emitting material provided on the planarization layer.

The method may further include forming at least one of an electron transport layer and a hole injection layer, the forming the at least one of the electron transport layer and the hole injection layer occurring between the forming of the organic light emitting layer and the forming of the cathode electrode.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention.

In the drawings.

DETAILED DESCRIPTION

Figure 1:
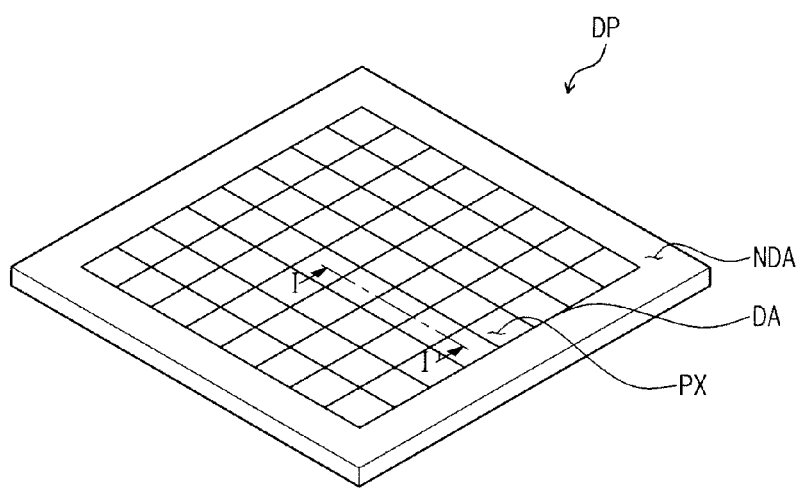
FIG. 1 is a perspective view of a display panel according to an embodiment of the present invention.

Hereinafter, an organic light emitting diode according to one embodiment of the present invention will be described in detail with reference to the accompanying drawings.

In the drawings, in order to clearly express several layers and regions, their thicknesses are enlarged. Like reference numerals refer to like elements throughout the specification. It will be understood that when an element such as a layer, film, region, or substrate is referred to as being "on" another element, it can be directly on the other element or intervening elements may also be present. Moreover, although one side of a layer is shown flat in the drawings, it is not necessarily required to be flat. There may be a stepped portion on the surface of an upper layer by the surface shape of a lower layer during a layer stacking process.

FIG. 1 is a perspective view of a display panel DP according to an embodiment of the present invention. The display panel DP includes a display area DA and a non display area NDA.

The non display area NDA is an area that does not display information in response to an electrical signal. The non display area NDA is a portion of the display panel DP located around (e.g., surrounding or at edges of) the display area DA.

The display area DA is an area that outputs information (e.g., light) in response to an electrical signal. The display area DA includes a plurality of pixels PX. Each of the plurality of pixels PX includes capacitors, transistors, and organic light emitting diodes.

Each of the plurality of pixels PX includes an organic light emitting diode. The organic light emitting diode will be described in more detail with reference to FIG. 2.

Figure 2:
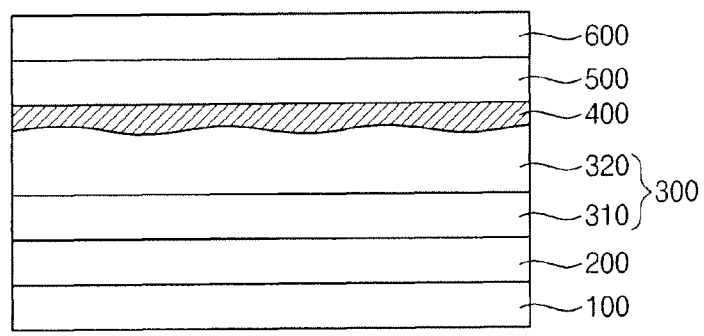
FIG. 2 is a cross-sectional view of an organic light emitting diode according to an embodiment of the present invention.

FIG. 2 is a cross-sectional view of an organic light emitting diode according to an embodiment of the present invention. As shown in FIG. 2, the organic light emitting diode includes a substrate 100, an anode electrode 200, a first common layer 300, a planarization layer 400, an organic light emitting layer 500, and a cathode electrode 600.

The substrate 100 may be a glass or plastic substrate. The substrate 100 may be the base member of a display panel. In some embodiments, an insulating layer may be further disposed on one side of the substrate 100. The insulating layer may include an organic layer and/or an inorganic layer.

The anode electrode 200 is on (e.g., disposed on or located on) the substrate 100. The anode electrode 200 may be formed of a material having a high conductivity and work function. The anode electrode 200 may be formed of a transparent conductive material.

For example, the anode electrode 200 may include indium tin oxide, indium zinc oxide, indium gallium zinc oxide, fluorine zinc oxide, gallium zinc oxide, tin oxide, zinc oxide, metallic single-walled carbon nanotube (SWCNT), or conductive polymer poly 3,4-ethylenedioxythiophene (PEDOT).

The first common layer 300 is on (e.g., disposed on or located on) the anode electrode 200. The first common layer 300 may inject or transport holes. Accordingly, the first common layer 300 improves the mobility of holes that the anode electrode 200 provides to the organic light emitting layer 500.

The first common layer 300 may include a non-flat side (or uneven). The non-flat side may cause stacking faults and life cycle reduction of the structure of an organic light emitting diode.

The first common layer 300 includes at least one of a hole injection layer 310 and a hole transport layer 320. In some embodiments, the first common layer 300 may include one layer for injecting and transporting holes. Or, as shown in the embodiment of FIG. 2, the first common layer 300 includes a plurality of multilayer structures.

The hole injection layer 310 facilitates hole injection to the organic light emitting layer 500 and increases the life cycle (or operating lifetime) of a device. The hole injection layer 310 may include a metallic compound having a semiconductor property or an organic matter and/or an inorganic matter. The hole injection layer 310 may be formed of aryl amine compounds and starburst amines.

The hole transport layer 320 improves the mobility of the injected holes. The hole transport layer 320 may consist of a single layer or multiple layers.

Each of the hole transport layer 320 and the hole injection layer 310 may transport holes. However, in a stacked layer structure, a layer may function as the hole transport layer 320 or the hole injection layer 310, according to the degree of hole transport ability.

The organic light emitting layer 500 is disposed on the first common layer 300. The organic light emitting layer 500 may be configured to generate blue light, green light, red light, or white light. The organic light emitting layer 500 includes a fluorescent material or a phosphorescent material.

The planarization layer 400 is disposed between the first common layer 300 and the organic light emitting layer 500. The planarization layer 400 includes perfluorocyclobutanes (PFCBs).

PFCBs, as an organic matter having a small dielectric constant, serve to enhance hole transport ability of a device. Additionally, PFCBs induce the organic light emitting layer 500 on the top to uniformly (or substantially uniformly) contact the top side of the planarization layer 400.

The planarization layer 400 covers (e.g., is located on) the non-flat (or uneven) side of the first common layer 300. The planarization layer 400 provides a flat side on an upper layer (e.g., a layer facing away from the first common layer 300) to allow a layer to be stacked flat on (e.g., above) the first common layer 300. Accordingly, the planarization layer 400 allows the organic light emitting layer 500 to closely contact to the top of the first common layer 300 without any gap (e.g., with the planarization layer 400 disposed therebetween).

Additionally, the planarization layer 400 reduces or prevents mixing (or color mixing) between the first common layer 300 and the organic light emitting layer 500. Accordingly, even when the organic light emitting layer 500 is provided (or deposited) in a liquid state, it is prevented from (or less susceptible to) being mixed with the first common layer 300.

The cathode electrode 600 is disposed on the organic light emitting layer 500. The cathode electrode 600 consists of a material having a lower work function than that of the anode electrode 200. For example, the cathode electrode 600 may include a metal such as lithium, magnesium, or aluminum.

Figure 3:
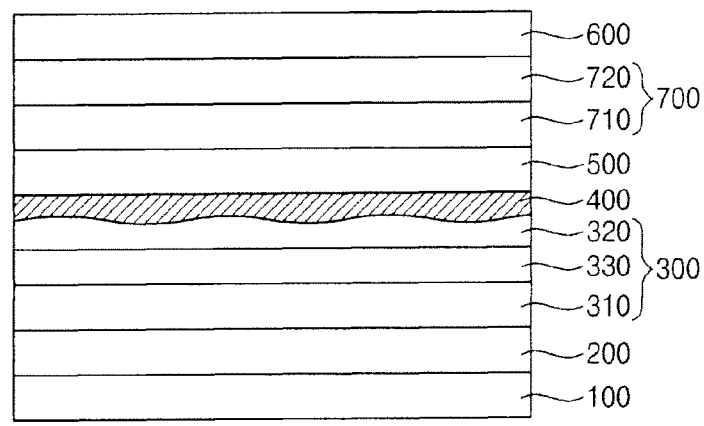
FIG. 3 is a cross-sectional view of an organic light emitting diode according to another embodiment of the present invention.

FIG. 3 is a cross-sectional view of an organic light emitting diode according to another embodiment of the present invention. As shown in FIG. 3, the organic light emitting diode may further include a charge generation layer 330 and a second common layer 700. Like reference numerals refer to like elements throughout FIGS. 1, 2, and 3 and their detailed descriptions are omitted.

The charge generation layer 300 is disposed between the hole injection layer 310 and the hole transport layer 320. Because the charge generation layer 330 transports charges and enhances the mobility of charges, it may be included in the first common layer 300.

When an electric field is applied, the charge generation layer 330 generates holes and electrons. The holes move toward the cathode electrode 600 and the electrons move toward the anode electrode 200. According to one embodiment, the charge generation layer 330 improves a luminous efficiency of an organic light emitting diode.

The charge generation layer 330 includes pigments such as pyrylium pigments, azo pigments, disazo pigments, triazo pigments, phthalocyanine pigments, indigo pigments, or triphenylmethane pigments.

The charge generation layer 330 is hydrophobic. Unlike this, the hole transport layer 320 is hydrophilic. Because the charge generation layer 330 and the hole transport layer 320 have different affinities, it is difficult for them to closely contact with each other. Accordingly, as shown in FIG. 3, the hole transport layer 320 a top side (e.g., a side away facing away from the charge generation layer 330) may be non-flat (or uneven).

The second common layer 700 is disposed between the organic light emitting layer 500 and the cathode electrode 600. The second common layer 700 may include an electron transport layer 710 and an electron injection layer 720.

The electron injection layer 720 allows electrons to be easily injected from the cathode electrode 600 to the organic light emitting layer 500. The electron injection layer 720 may be formed of a single layer or multiple layers.

The electron transport layer 710 improves the mobility of the electrons and improves the transport of electrons to the organic light emitting layer 500. The electron transport layer 710 may be formed of a single layer or multiple layers.

As shown in FIG. 3, in one embodiment the second common layer 700 is formed of at least two layers. In other embodiments, the second common layer 700 is formed of a single layer that includes all functions of injecting or transporting electrons.

Each of the electron transport layer 710 and the electron injection layer 720 may transport electrons. However, in a stacked layer structure, a layer may function as the electron transport layer 710 or the electron injection layer 720, according to the degree of electron transport ability.

In some embodiments, the second common layer 700 may further include a hole blocking layer between the organic light emitting layer 500 and the electron transport layer 710. The hole blocking layer impedes or prevents holes from moving to an electron injection layer when hole mobility is greater than electron mobility in the organic light emitting layer 500.

Figure 4:
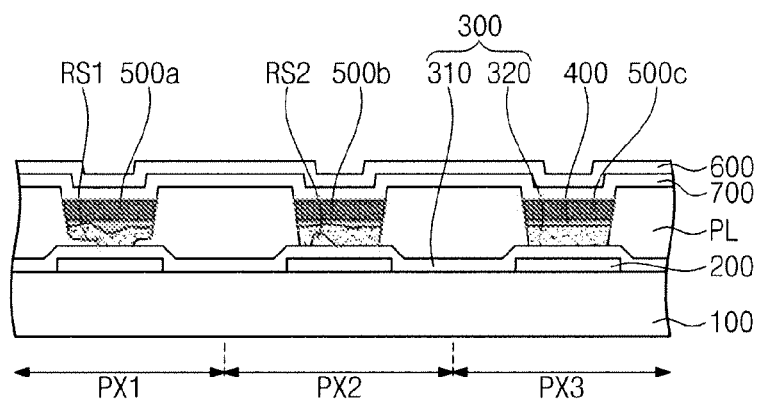
FIG. 4 is a cross-sectional view of an organic light emitting display panel according to an embodiment of the present invention.
Figure 5:
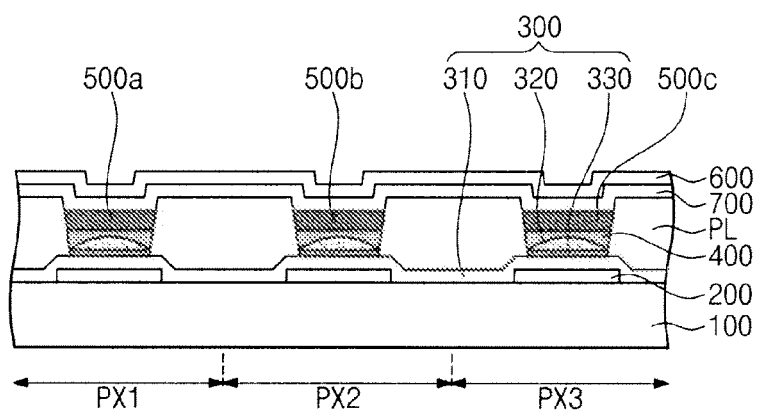
FIG. 5 is a cross-sectional view of an organic light emitting display panel according to another embodiment of the present invention.

An organic light emitting display panel according to one embodiment will be described with reference to FIGS. 4 and 5. FIGS. 4 and 5 are cross-sectional views taken along the line I-I' of FIG. 1 according to embodiments of the present invention. The organic light emitting display panel shown in FIGS. 4 and 5 includes three pixel areas PX1, PX2, and PX3. Like reference numerals refer to like elements throughout FIGS. 1 and 3, and their detailed descriptions will not be repeated herein.

FIG. 4 is a cross-sectional view of an organic light emitting display panel according to an embodiment of the present invention. The organic light emitting display panel includes a substrate 100, an anode electrode 200, a hole injection layer 310, a pixel definition layer PL, a hole transport layer 320, a planarization layer 400, an organic light emitting layer 500, a second common layer 700, and a cathode electrode 600.

The substrate 100 may include at least one driving device. The driving device may include a capacitor, a transistor, and so on.

The driving devices may be disposed in each of the pixel areas PX1, PX2, and PX3 of the substrate 100. The driving devices drive organic light emitting diodes in each pixel area. The organic light emitting display panel implements (or displays) information in accordance with the behavior of the driving devices.

The anode electrodes 200 on the substrate 100 form a lower electrode layer of a display panel. Each anode electrode 200 may be formed to have the same area (or to have the same width) as the pixel PX of FIG. 1. The anode electrode 200 is provided to each pixel PX.

The pixel definition layer PL is disposed on the hole injection layer 310. The pixel definition layer PL exposes the areas in which the hole injection layer 310 overlaps the anode electrode 200. In relation to the organic light emitting display panel, the pixel definition layer PL separates (or compartmentalizes) the pixel areas PX1, PX2, and PX3.

The pixel definition layer PL has an insulation property (e.g., is an insulator) and includes a photosensitive material. The photosensitive material is a material sensitive to light and includes an organic matter or an inorganic matter. For example, the pixel definition layer PL may be formed of an organic matter such as N,N-diethylacetamide, polyimide, polybenzoxazole, polyglutarimide, benzocyclobutene (BCB), polyethylene, polystyrene, and polypropylene. Or, the pixel definition layer PL may be formed of an inorganic matter such as $SiO_2$, $Si_3N_4$, and $Al_2O_3$.

As shown in FIG. 4, in one embodiment the organic light emitting layer 500 is provided in each of the three pixel areas PX1, PX2, and PX3. Organic light emitting layers 500a, 500b, and 500c may emit the same color or different colors.

For example, the first organic light emitting layer 500a may include a red light emitting material, the second organic light emitting layer 500b may include a green light emitting material, and the third organic light emitting layer 500c may include a blue light emitting material.

As shown in FIG. 4, according to one embodiment the cathode electrode 600 is disposed to face the anode electrode 200. Accordingly, the cathode electrode 600 may be formed in a direction intersecting (or crossing) the anode electrode 200, and may be formed to cover the whole side of a display panel according to an embodiment of the present invention.

As shown in FIG. 4, the organic light emitting display panel includes some residues RS1 and RS2. The residues RS1 and RS2 may be formed of the same material as the pixel definition layer PL. Accordingly, the residues RS1 and RS2 may include a photosensitive material.

The residues RS1 and RS2 may be formed in a variety of forms (or shapes or types). As shown in FIG. 4, an organic light emitting display panel may include one or more residues of the type of the first residue RS1 or the type of the second residue RS2.

The first residue RS1 is of a type that protrudes from the pixel definition layer PL. The first residue RS1 is connected to the pixel definition layer PL, as part thereof. The first residue RS1 covers the peripheral part of the exposed side (or portion) of hole transport layer 310.

The second residue RS2 is disposed on the hole injection layer 310, and overlaps a portion of the hole injection layer 310. The second residue RS2 is of a type that is spaced apart from (e.g., spaced away from) the pixel definition layer PL.

The non-flat side of the first common layer 300 may have an uneven surface with continuous curvature. The uneven surface is formed by (or caused by) the residues RS1 and RS2. During a printing process, a hole transport material may be deposited in a liquid state and may traps the residues RS1 and RS2 when forming the hole transport layer 320.

The hole transport layer 320 formed when (or after) the hole transport material is dried may have an uneven top side. The non-flat side may cause contact failure between the hole transport layer 320 and the organic light emitting layer 500.

As shown in FIG. 4, according to one embodiment the planarization layer 400 is disposed on the uneven surface, thereby planarizing the top side of the hole transport layer 320 on which the organic light emitting layer 500 is stacked.

Accordingly, stacked layer defects (e.g., defects arising from irregularities in the stacked layers) may be prevented from occurring in the organic light emitting layer 500.

Additionally, the planarization layer 400 reduces or prevents direct contact between the hole transport layer 320 and the organic light emitting layer 500. Therefore, mixing (or color mixing) between the hole transport layer 320 and the organic light emitting layer 500 may be reduced or prevented during a solution (or wet) process such as a printing process.

FIG. 5 is a cross-sectional view of an organic light emitting display panel according to another embodiment of the present invention. As shown in FIG. 5, the organic light emitting display panel may further include a charge generation layer 330. The charge generation layer 330 is disposed on the exposed side of hole injection layer 310.

The hole transport layer 320 includes a non-flat side, and as shown in FIG. 5, the non-flat side may be a convex side in at least some areas. The charge generation layer 330 consists of a material having a different polarity from that of the hole transport layer 320.

Accordingly, as shown in FIG. 5, the difference in polarity between difficult that the hole transport layer 320 is uniformly applied to the charge generation layer 330 so as to closely contact it. The hole transport layer 320 on the charge generation layer 330 has a top side whose portion is in a convex spherical form like water drop.

The planarization layer 400 planarizes the top side of the hole transport layer 320, whose surface is uneven due to the charge generation layer 330. Due to the planarization layer 400, stacking faults may not occur in the organic light emitting layer 500. Additionally, the planarization layer 400 reduces or prevents mixing (or color mixing) between the organic light emitting layer 500 and the hole transport layer 320.

FIGS. 6A, 6B, 6C, 6D, 6E, 6F, 6G, and 6H are cross-sectional views illustrating a method of manufacturing an organic light emitting diode according to an embodiment of the present invention. FIGS. 6A, 6B, 6C, 6D, 6E, 6F, 6G, and 6H exemplarily illustrate a method of manufacturing an organic light emitting diode having the same layer structure as the organic light emitting display panel of FIG. 4. Accordingly, like reference numbers refer to like elements.

Figure 6A:
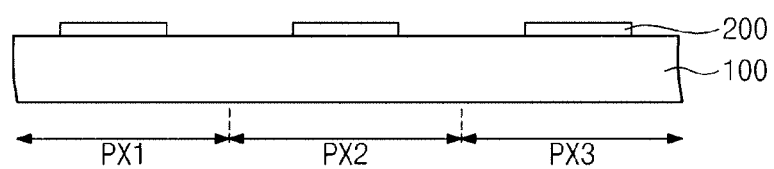
FIGS. 6A, 6B, 6C, 6D, 6E, 6F, 6G, and 6H are cross-sectional views illustrating a method of manufacturing an organic light emitting diode according to an embodiment of the present invention.

As shown in FIG. 6A, the anode electrode 200 is formed on the substrate 100. The anode electrode 200 may be formed by forming an electrode layer on one side of substrate 100 using a transparent conductive material and then patterning the electrode layer.

The anode electrode 200 may be formed through various methods. For example, the anode electrode 200 may be formed through a coating method, an evaporation method, a vapor deposition method, an e-beam deposition method, or a sputtering method, but embodiments of the present invention are not limited thereto.

The anode electrode 200 may be formed on an insulating layer. The insulating layer may consist of a plurality of thin layers stacked sequentially. Additionally, the substrate 100 may be provided including a driving device unit. The driving device unit may include a thin film transistor, a capacitor, and switching thin film transistors.

The driving device unit may be formed according to a well-known manufacturing process, and its detailed description is omitted. The plurality of thin layers in the insulating layer may be a part of the driving device unit.

Figure 6B:
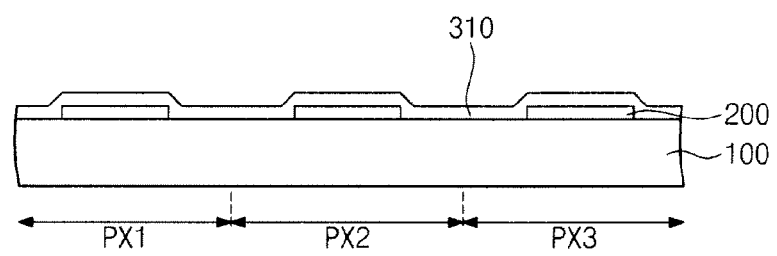

As shown in FIG. 6B, the hole injection layer 310 is formed on the anode electrode 200. The hole injection layer 310 may be formed on the whole (or entire) side of the substrate 100.

Figure 6C:
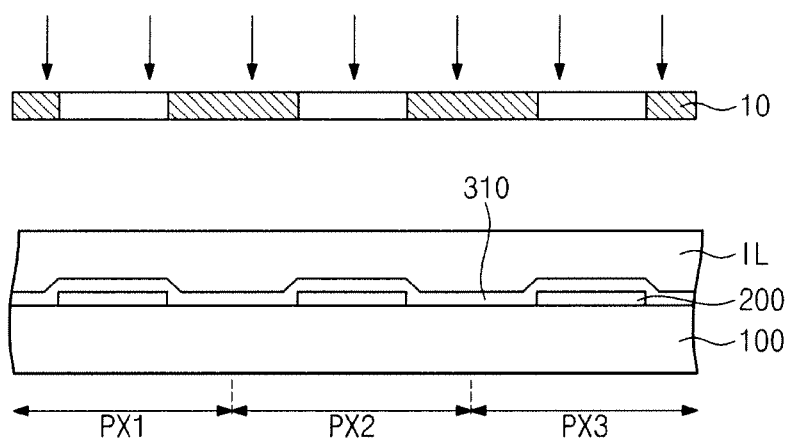
Figure 6D:
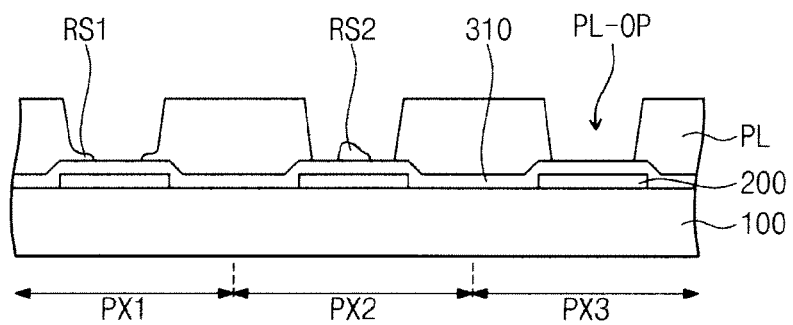

As shown in FIGS. 6C and 6D, the pixel definition layer PL is formed on the hole injection layer 310. In order to form the pixel definition layer PL, an insulating layer IL is formed covering the whole (or entire) side of the hole injection layer 310.

As shown in FIG. 6C, the pixel definition layer PL may be formed by patterning the insulating layer IL. A mask 10 is disposed on (or over) the insulating layer IL, and laser or light is emitted thereon. The patterning process includes exposure and development processes.

As shown in FIG. 6D, the insulating layer IL includes a photosensitive material. Accordingly, some areas of the insulating layer IL that are irradiated with light (or laser light) are removed to form an opening PLOP. A plurality of openings PO-OP may be formed. The opening PL-OP exposes the areas of the hole injection layer 310 corresponding to the anode electrode 200.

Referring to FIG. 6D, the residues RS1 and RS2 having various shapes or forms may be disposed on a surface of (e.g., the top side of) the hole injection layer 310 exposed by the opening PL-OP. The residues RS1 and RS2 may be formed during the patterning process of the pixel definition layer PL.

The first residue RS1 in the first pixel area PX1 protrudes from the pixel definition layer PL into the opening PL-OP. The first residue RS1 may be formed when some portions of the insulating layer IL in an area corresponding to the opening PL-OP (e.g., edges of the opening PL-OP) are not removed.

The second residue RS2 in the second pixel area PX2 is spaced apart from the pixel definition layer PL and overlaps part of the hole injection layer 310. The second residue RS2 may be generated when some particles of the etched insulating layer IL remain in (e.g., are not etched away) the opening PL-OP during the formation of the pixel definition layer PL.

Figure 6E:
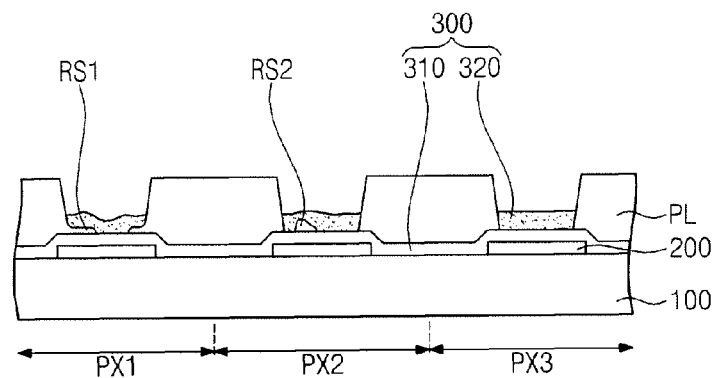

As shown in FIG. 6E, after the pixel definition layer PL is formed, the hole transport layer 320 is formed. The hole transport layer 320 is formed in the opening PL-OP, and the residues RS1 and RS2 are covered by (or embedded in) the hole transport layer 320.

The shape of the hole transport layer 320 is affected by the shape of a surface on which it is disposed. Accordingly, the residues RS1 and RS2 may affect the shape of the hole transport layer 320, and an uneven surface may be formed on the top side of the hole transport layer 320 (e.g., the side of the hole transport layer 320 facing away from the substrate 100, anode electrode, and/or the hole injection layer 310).

The hole transport layer 320 may be formed through various methods such as a deposition method and a coating method. In addition, in the context of an organic light emitting display panel, the hole transport layer 320 may be formed through a printing method.

Figure 6F:
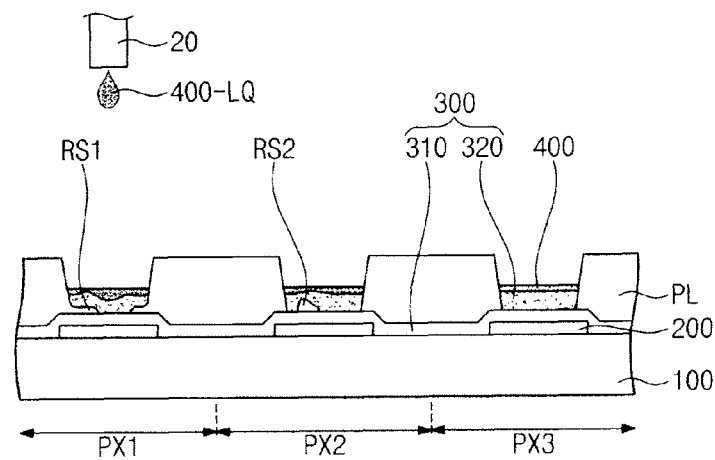

As shown in FIG. 6F, the method of manufacturing an organic light emitting device includes forming the planarization layer 400 on the hole transport layer 320. The planarization layer 400 may be formed through a slit coating method, a printing method, or a spin coating method. The forming of the planarization layer 400 includes providing a liquid planarization material 400-LQ and a drying operation.

A solution inlet 20 provides the liquid planarization material 400-LQ to the opening PL-OP. The liquid planarization material 400-LQ includes PFCBs. The liquid planarization material 400-LQ closely contacts the hole transport layer 320 by filling the uneven surface of the non-flat side of the hole transport layer 320.

The drying operation forms the planarization layer 400 by using the liquid planarization material 400-LQ provided to the opening PL-OP. Through the drying operation, the liquid planarization material 400-LQ forms the solid-state planarization layer 400 having a flat side after moisture is evaporated (e.g., after the liquid planarization material 400-LQ has dried).

Figure 6G:
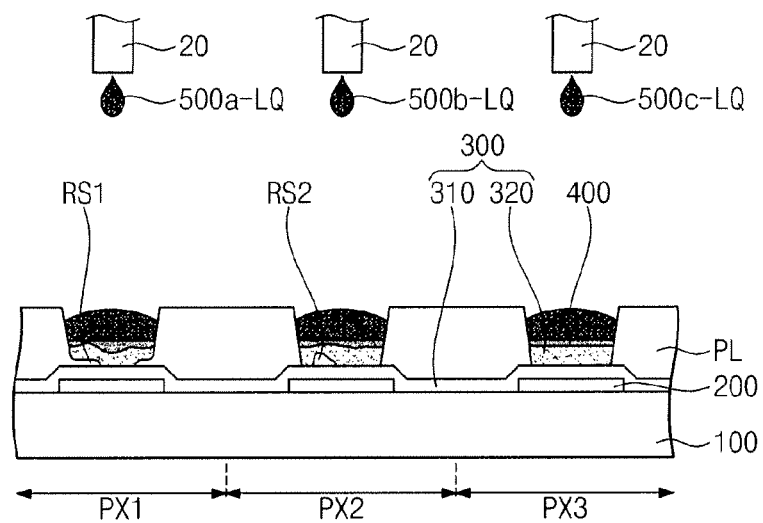

As shown in FIG. 6G, the organic light emitting layer 500 is formed on the planarization layer 400. Organic light emitting layers 500a, 500b, and 500c respectively formed in the pixel areas PX1, PX2, and PX3 may be formed of materials having the same or different colors.

The organic light emitting layer 500 may be provided (e.g., initially deposited) in a liquid state. Accordingly, the organic light emitting layer 500 may be formed through a printing or inkjet method.

As shown in FIG. 6G, the organic light emitting layer 500 is formed on the planarization layer 400. Accordingly, the surface condition of the hole transport layer 320 (e.g., unevenness of the top surface of the hole transport layer) has a reduced effect on the organic light emitting layer 500. In addition, when the organic light emitting layer 500 is formed through a printing method, mixing (or color mixing) between the organic light emitting layer 500 and the hole transport layer 320 is reduced.

Figure 6H:
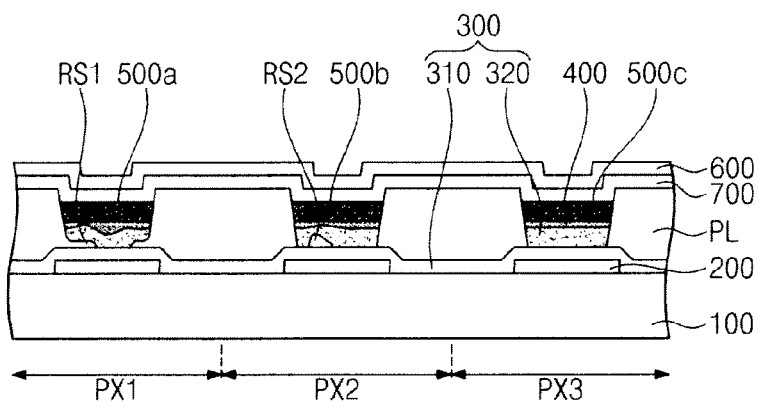

As shown in FIG. 6H, the second common layer 700 is formed on the organic light emitting layer 500, and the cathode electrode 600 is formed on the second common layer 700. The second common layer 700 may be omitted.

The second common layer 700 may be formed on the entire side of the display panel to cover the pixel definition layer PL. The cathode electrode 600 may be formed using the same method as the method used to form the anode electrode 200.

The second common layer 700 may consist of a single layer configured to inject and transport electrons. In other embodiments, the second common layer 700 may consist of multiple layers, each being configured to inject or transport electrons.

Once the processes described above with respect to FIGS. 6A, 6B, 6C, 6D, 6E, 6F, 6G, and 6H are completed, the organic light emitting display panel of FIG. 4 is manufactured. The organic light emitting display panel may have a structure of layers contacting each other closely and uniformly stacked, even when the device includes impurities such as residues.

FIGS. 7A, 7B, 7C, 7D, 7E, 7F, 7G, 7H, and 7I are cross-sectional views illustrating a method of manufacturing an organic light emitting diode according to another embodiment of the present invention. FIGS. 7A, 7B, 7C, 7D, 7E, 7F, 7G, 7H, and 7I illustrate a method of manufacturing an organic light emitting display panel having the layer structure of FIG. 5. Accordingly, like reference numbers refer to like elements.

Figure 7A:
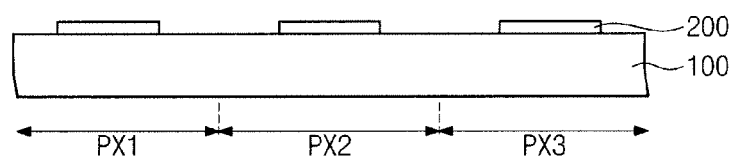
FIGS. 7A, 7B, 7C, 7D, 7E, 7F, 7G, 7H, and 7I are cross-sectional views illustrating a method of manufacturing an organic light emitting diode according to another embodiment of the present invention.
Figure 7B:
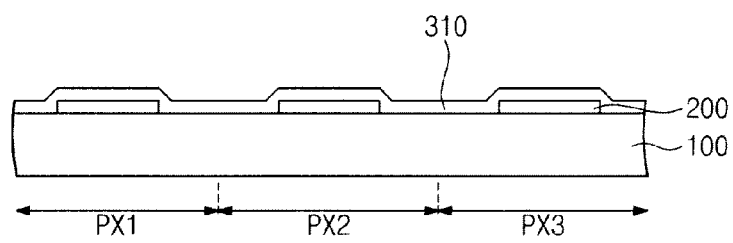
Figure 7C:
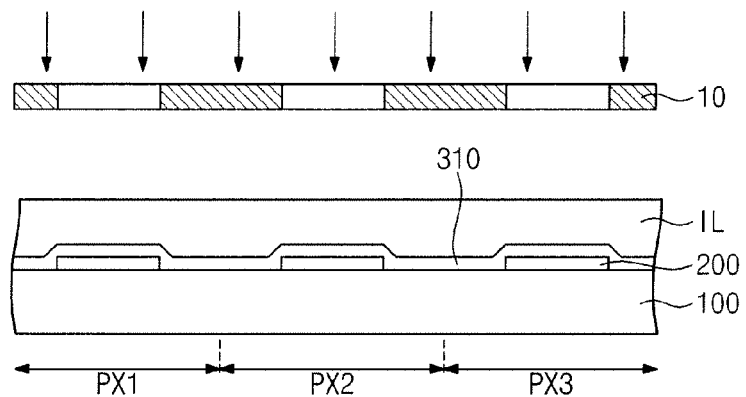

The manufacturing processes shown in FIGS. 7A, 7B, and 7C are substantially the same as those of FIGS. 6A, 6B, and 6C. Therefore, their descriptions are not repeated herein.

Figure 7D:
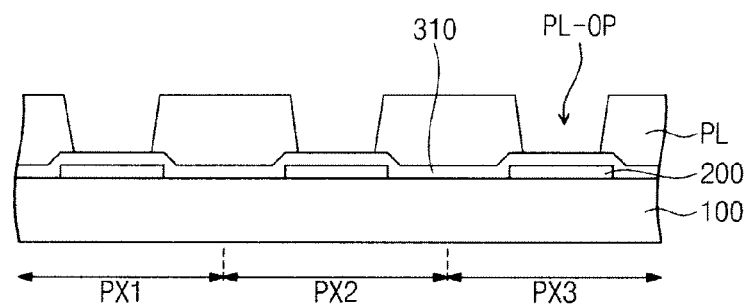

As shown in FIG. 7D, the pixel definition layer PL including the opening PL-OP is formed on the hole injection layer 310. Unlike the embodiments shown in FIG. 6D, substantially no residues RS1 and RS2 are formed (or left behind) on the hole injection layer 310 in FIG. 7D.

Figure 7E:
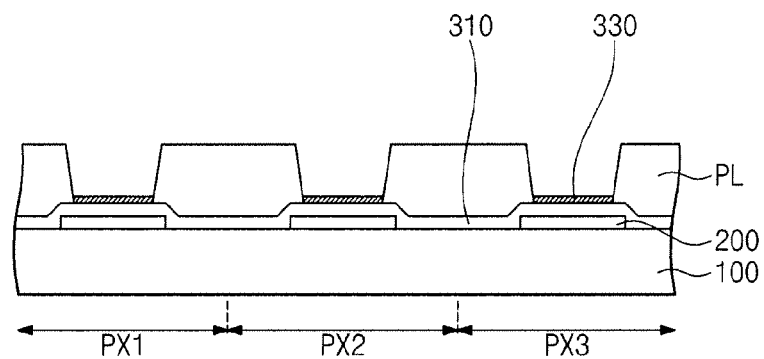

As shown in FIG. 7E, the charge generation layer 330 is formed on the exposed side of the hole injection layer 310. The charge generation layer 330 may be formed of a single layer or multiple layers.

The charge generation layer 330 may be uniformly applied on the hole injection layer 310 through a deposition process. In addition, the charge generation layer 330 may be formed by providing a solution and coating the hole injection layer 310 with the solution.

Figure 7F:
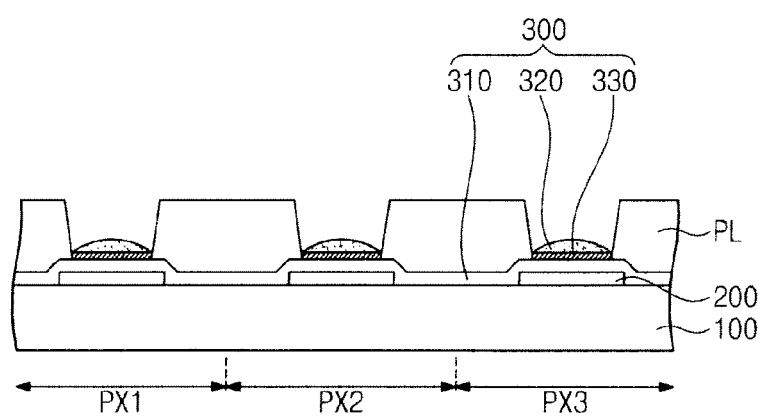

As shown in FIG. 7F, the hole transport layer 320 is formed on the charge generation layer 330. In one embodiment, the hole transport layer 320 is provided as a liquid and is applied on the charge generation layer 330.

The charge generation layer 330 consists of a material having a different polarity than that of the hole transport layer 320. Accordingly, it may be difficult for the hole transport layer 320 to closely contact the top of the charge generation layer 330.

Due to the difficulty in the contact between the hole transport layer 320 and the charge generation layer 330, the hole transport layer 320 has a non-flat side, and, as shown in FIG. 7F, the non-flat side may have a substantially hemispherical shape. In addition, the charge generation layer 330 may not be covered (or may not be completely covered) by the hole transport layer 320 and may include a partially-exposed side (or surface).

Figure 7G:
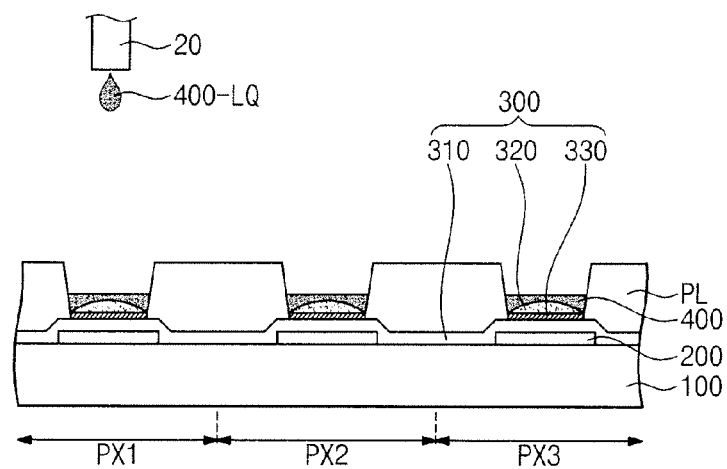

As shown in FIG. 7G, according to one embodiment the planarization layer 400 is formed on the top side of the hole generation layer 320. The planarization layer 400 is provided as a liquid planarization material 400-LQ through the solution inlet 2, so as to cover the hemispherical surface of the hole transport layer 320.

The liquid planarization material 400-LQ closely contacts the hole transport layer 320 by filling (or surrounding) the hemispherical surface and its peripheral areas. The liquid planarization material 400-LQ forms, through a drying operation, the planarization layer 400, which has a substantially flat side on an upper layer.

Figure 7H:
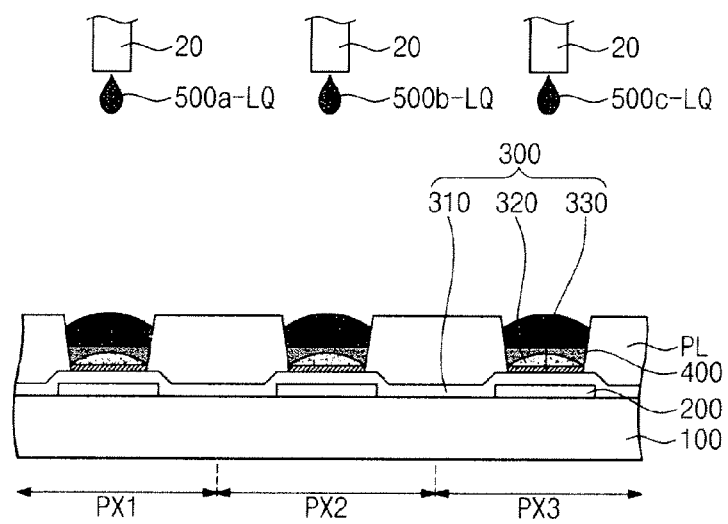
Figure 7I:
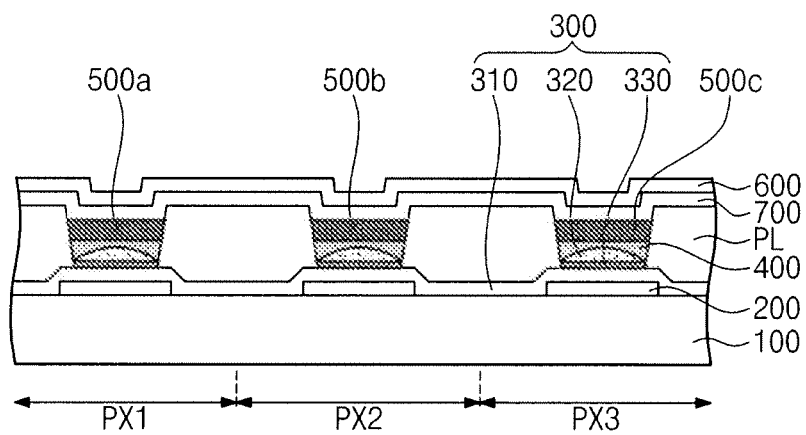

As shown in FIGS. 7H and 7I, the organic light emitting layer 500, a third organic layer, and the cathode electrode 600 are formed on the planarization layer 400. The third organic layer includes the second common layer 700. Because processes of forming the organic light emitting display panel are identical to those of FIGS. 6G and 6H, their repeated descriptions are omitted.

As mentioned above, an organic light emitting diode according to an embodiment of the present invention may include a first common layer having an uneven top side and may include a planarization layer on the uneven top side. The organic light emitting device has a substantially uniform stacked layer structure by using the planarization layer to planarize the structure even when there are uneven or non-flat interfaces within the structure.

Moreover, a method of manufacturing an organic light emitting display panel according to an embodiment of the present invention is provided. The method provides an organic light emitting display panel having reduced mixing (or color mixing) between layers and stacked layer defects and improving a lifecycle even when a printing process is performed.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An organic light emitting diode comprising:
   an anode electrode on a substrate;
   a first common layer on the anode electrode, the first common layer being configured to inject or transport holes and having a non-flat side;
   an organic light emitting layer on the first common layer;
   a planarization layer on the non-flat side of the first common layer, having a flat side facing the organic light emitting layer, the planarization layer being configured to transport holes from the first common layer to the organic light emitting layer, and comprising perfluorocyclobutanes (PFCBs); and
   a cathode, electrode on the organic light emitting layer.

2. The organic light emitting diode of claim 1, wherein the first common layer comprises at least one of a hole injection layer and a hole transport layer.

3. The organic light emitting diode of claim 1, wherein the first common layer comprises:
   a hole injection layer;
   a charge generation layer; and
   a hole transport layer,
   wherein the hole injection layer, the charge generation layer, and the hole transport layer are stacked sequentially, and
   wherein the charge generation layer has a first polarity and the hole transport layer has a second polarity different from the first polarity.

4. The organic light emitting diode of claim 1, further comprising a second common layer between the organic light emitting layer and the cathode electrode and configured to inject or transport electrons from the cathode electrode to the organic light emitting layer.

5. The organic light emitting diode of claim 4, wherein the second common layer comprises at least one of an electron injection layer and an electron transport layer.

6. An organic light emitting display panel comprising:
   a substrate;
   an anode electrode on the substrate;
   a hole injection layer on the anode electrode;
   a pixel definition layer on the hole injection layer, the pixel definition layer having an opening exposing a portion of the hole injection layer overlapping the anode electrode of the hole injection layer;
   a hole transport layer on the exposed hole injection layer, the hole transport layer having a non-flat side;
   an organic light emitting layer on the hole transport layer;
   a planarization layer on the non-flat side of the hole transport layer, the planarization layer having a flat side facing the organic light emitting layer, the planarization layer being configured to transport holes from the hole transport layer to the organic light emitting layer, and the planarization layer comprising perfluorocyclobutanes (PFCBs); and
   a cathode electrode on the organic light emitting layer.

7. The organic light emitting display panel of claim 6, further comprising a residue on the hole injection layer and overlapping a portion of the hole injection layer.

8. The organic light emitting display panel of claim 7, wherein the non-flat side of the hole transport layer has an uneven surface in an area corresponding to the residue.

9. The organic light emitting display panel of claim 8, wherein the residue is formed of the same material as the pixel definition layer.

10. The organic light emitting display panel of claim 9, wherein the residue protrudes from the pixel definition layer into the opening exposing the exposed portion of the hole injection layer.

11. The organic light emitting display panel of claim 6, further comprising a charge generation layer between the hole injection layer and the hole transport layer, and the charge generation layer having a different polarity from the hole transport layer.

12. The organic light emitting display panel of claim 11, wherein one or more portions of the non-flat side are convex.

13. The organic light emitting display panel of claim 6, further comprising an electron injection layer disposed between the organic light emitting layer and the cathode electrode.

14. The organic light emitting display panel of claim 13, further comprising an electron transport layer disposed between the electron injection layer and the organic light emitting layer.

15. The organic light emitting display panel of claim 6, wherein the pixel definition layer comprises a photosensitive material.

\* \* \* \* \*